(12) United States Patent
Champion et al.

(10) Patent No.: US 7,711,018 B2
(45) Date of Patent: May 4, 2010

(54) METHOD AND APPARATUS FOR LASER DIODE COMPENSATION

(75) Inventors: Mark Champion, Kenmore, WA (US); Heng Huang, Sammamish, WA (US)

(73) Assignee: Microvision, Inc., Redmond, WA (US)

( * ) Notice: Subject to any disclaimer, the term of this patent is extended or adjusted under 35 U.S.C. 154(b) by 114 days.

(21) Appl. No.: 11/962,602

(22) Filed: Dec. 21, 2007

(65) Prior Publication Data

US 2009/0161707 A1  Jun. 25, 2009

(51) Int. Cl.
 *H01S 3/13* (2006.01)
(52) U.S. Cl. .................................. 372/29.011
(58) Field of Classification Search ............. 372/29.011
 See application file for complete search history.

(56) References Cited

U.S. PATENT DOCUMENTS

| | | | | |
|---|---|---|---|---|
| 4,483,004 A | * | 11/1984 | Inaba et al. | 372/8 |
| 5,636,264 A | * | 6/1997 | Sulavuori et al. | 398/41 |
| 6,606,332 B1 | * | 8/2003 | Boscha | 372/42 |
| 6,661,820 B1 | * | 12/2003 | Camilleri et al. | 372/38.09 |
| 6,975,658 B1 | | 12/2005 | Roach | |
| 2006/0029295 A1 | * | 2/2006 | Wine et al. | 382/312 |
| 2007/0114361 A1 | | 5/2007 | Kunst et al. | |
| 2008/0128587 A1 | | 6/2008 | Lyu et al. | |

FOREIGN PATENT DOCUMENTS

JP  07141677  6/1995

* cited by examiner

*Primary Examiner*—Minsun Harvey
*Assistant Examiner*—Patrick Stafford
(74) *Attorney, Agent, or Firm*—Kevin D. Wills

(57) ABSTRACT

The luminance of a laser diode is a function of laser diode drive current. The luminance is also a function of other factors, such as age and temperature. A laser projection device includes laser diodes to generate light in response to a commanded luminance, and also includes photodiodes to provide a measured luminance. The commanded luminance and measured luminance are compared, and drive currents for the laser diodes are adjusted to compensate for changes in laser diode characteristics.

19 Claims, 7 Drawing Sheets

METHOD AND APPARATUS FOR LASER DIODE COMPENSATION

FIELD

The present invention relates generally to laser projection systems, and more specifically to compensation for nonlinearities in laser projection systems.

BACKGROUND

Laser diodes emit light when current is passed through the diode. The output luminance of the laser diode varies as the drive current through the diode is varied. The output luminance of the laser diode may also vary due to other factors. For example, the output luminance of the laser diode may vary with age. Also for example, the output luminance of the laser diode may vary as the temperature of the diode varies. This can be problematic in part because the temperature of a laser diode may be affected by ambient temperature changes as well as the historical drive current which results in "self-heating" of the diode.

Laser projectors that utilize laser diodes for light generation may suffer from variations in luminance as a result of aging, temperature changes, and other factors. These problems may occur in both monochrome and color laser projectors. For example, monochrome laser projectors may suffer from non-uniform greyscale displays over time. Similarly, the luminance of the various colors in a displayed image may change as the luminance of each color laser diode in a color projector changes. The color balance may also be affected if different color laser diodes have different responses to factors that affect luminance (e.g., aging, temperature, etc.).

DESCRIPTION OF EMBODIMENTS

Figure 1:
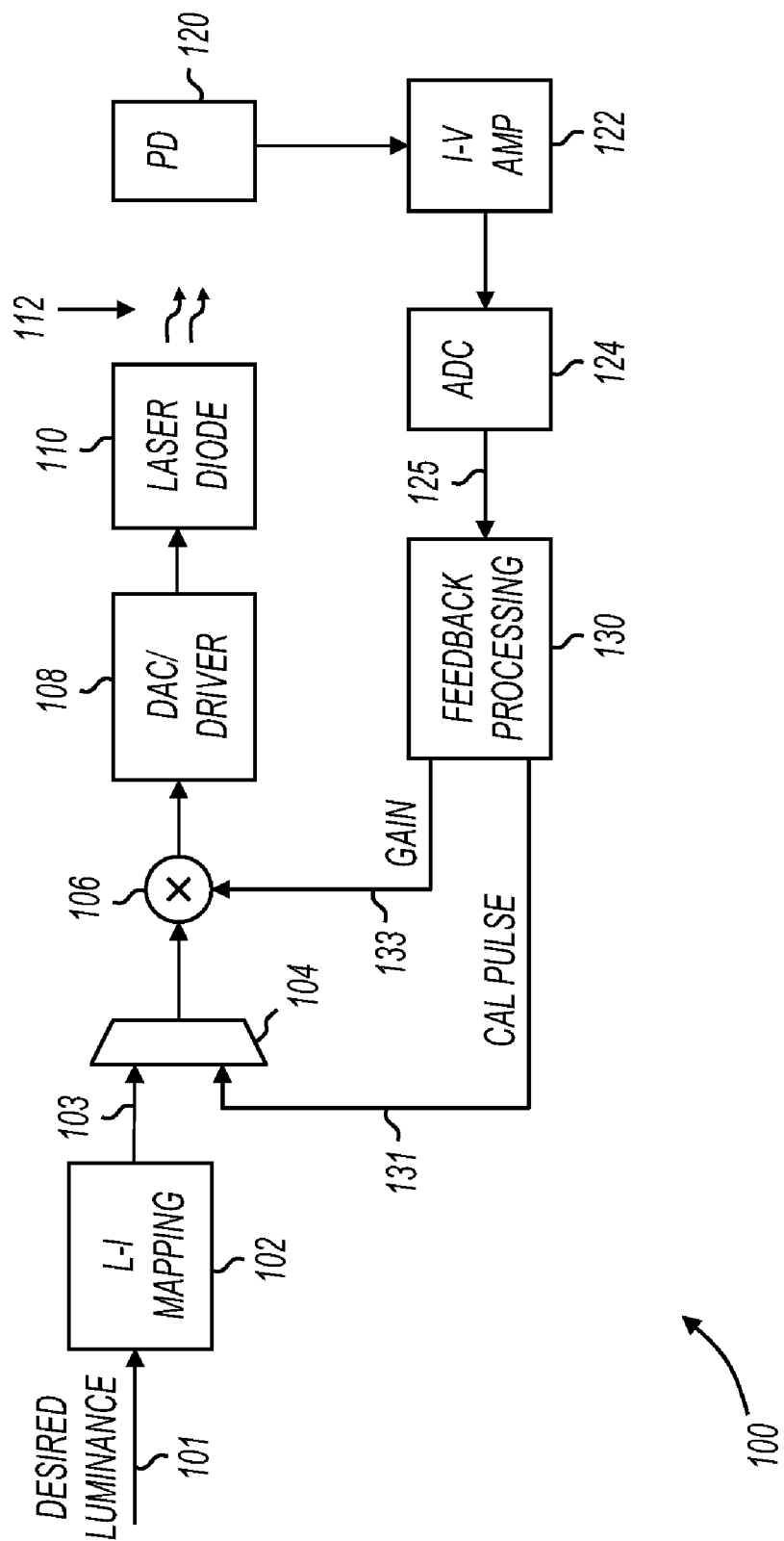
FIG. 1 shows a laser projection apparatus with laser diode drive current compensation.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a laser projection apparatus with laser diode drive current compensation. Laser projection apparatus 100 produces laser light 112 in response to a desired luminance value on node 101. The luminance value may be produced by any appropriate data source, and the resulting laser light may be projected for any purpose. For example, in some embodiments, an image processing apparatus may provide the desired luminance value, and laser projection apparatus 100 may display an image.

Apparatus 100 includes luminance to drive current (L-I) mapping 102, multiplexer 104, multiplier 106, digital-to-analog converter (DAC) and driver 108, and laser diode 110. Apparatus 100 also includes a feedback loop that includes photodiode 120, transimpedance amplifier (I-V AMP) 122, analog-to-digital converter (ADC) 124, and feedback processing component 130.

Laser diode 110 has a nonlinear drive current to output luminance characteristic. A typical laser diode characteristic is shown at 220 in FIG. 2. Mapping component 102 substantially implements the inverse of the laser diode characteristic. A typical mapping component characteristic is shown at 210 in FIG. 2. When the characteristic of the mapping component is combined with the characteristic of the laser diode, a substantially linear result is obtained (shown at 230 in FIG. 2).

Figure 3:
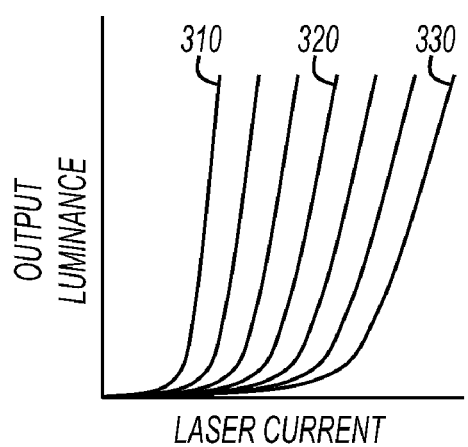
FIG. 3 shows a family of laser diode characteristic curves.

Due to various factors, including temperature and age, the laser diode characteristic may change over time. For example, FIG. 3 shows a family of laser diode characteristic curves. As seen in FIG. 3, the laser diode output luminance may take on different values for the same drive current depending on which of the curves correctly describes operation of the laser diode.

Curve 320 may describe a nominal operating condition for a laser diode. For example, a new diode operating at 25 degrees Celsius may operate in accordance with curve 320. As the temperature increases and/or the diode ages, the operation of the diode may be more correctly described by a curve to the right (e.g., 330). As the temperature decreases, the operation of the diode may be more correctly described a curve to the left (e.g., 310). During operation of a laser projection apparatus, the operating characteristic of laser diode (s) may continuously vary between the family of curves shown in FIG. 3.

Figure 2:
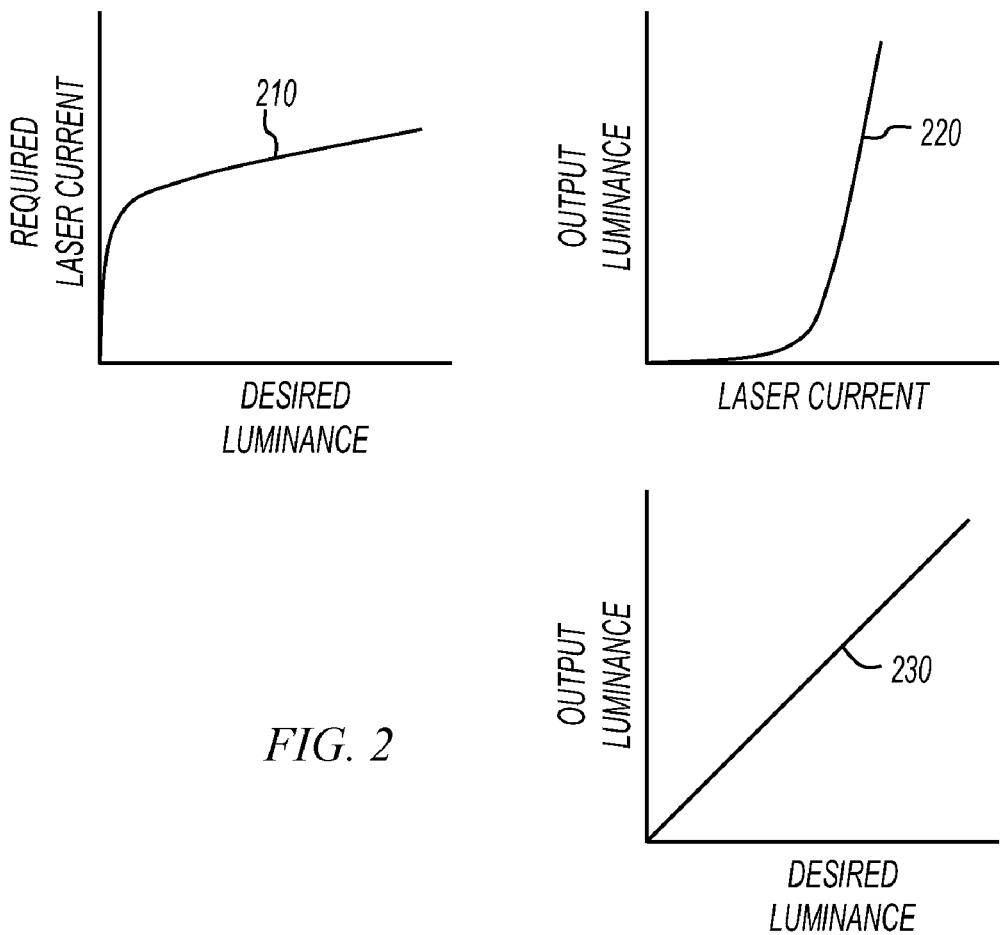
FIG. 2 shows various characteristics for luminance-to-current mappings, laser diodes, and combinations thereof.

Various embodiments of the present invention compensate for the variations shown in FIG. 3 by increasing or decreasing the drive current as necessary to substantially maintain an overall linear system characteristic (as exemplified by 230 in FIG. 2).

Referring now back to FIG. 1, in operation, mapping component 102 receives a desired luminance value on node 101, and maps the desired luminance to a nominal drive current value on node 103. The nominal drive current corresponds to one operating curve of the laser diode. For example, mapping component 102 may map luminance values to drive current values to compensate for the nominal laser diode operating curve 320 (FIG. 3).

Multiplexer 104 selects between the nominal drive current on node 103 and a calibration pulse value on node 131, and provides the selected data to multiplier 106. Multiplier 106 multiplies the selected data and a gain value received on node 133, and provides the result to DAC/driver 108. DAC/driver 108 converts the output of multiplier 106 into an analog current suitable to drive laser diode 110. In response to the drive current, laser diode 110 produces light at 112.

Laser diode 110 may heat up or cool off based on ambient temperature changes. Further, laser diode 110 may heat up when emitting light. Further, multiple historical drive currents may have a cumulative heating effect on laser diode 110. As described above with reference to FIG. 3, as the temperature of a laser diode changes, the luminance for a given drive current also changes. This can result in variations in overall luminance (brightness) of a displayed image. Other factors may also affect laser diode luminance over time. For example, the luminance of laser diodes may change over time due to aging.

Apparatus 100 includes a feedback loop to compensate for changes in laser diode characteristics. These changes may be due to temperature, aging, or any other factor. The feedback loop includes photodiode (PD) 120 to measure the actual output luminance of laser diode 110. The current output from photodiode 120 is processed by transimpedance amplifier 122 to provide a voltage to ADC 124. The magnitude of the voltage on node 125 corresponds to the measured output luminance.

Feedback processing component 130 receives the measured output luminance value on node 125 and modifies a gain value on node 133 in response thereto. If the measured output luminance is too low, feedback processing component 130 increases the gain value, thereby increasing the drive current provided to the laser diode. If the measured output luminance is too high, feedback processing component 130 decreases the gain value, thereby decreasing the drive current provided to the laser diode.

Feedback processing component 130 also provides a calibration pulse value on node 131. In some embodiments, multiplexer 104 periodically selects the calibration pulse data to provide to multiplier 106. When this occurs, laser diode 110 outputs light corresponding to the combination of the calibration pulse data and the gain value, both provided by feedback processing component 130. The feedback loop then measures the light produced in response to the calibration pulse, and adjusts the gain value accordingly.

The various embodiments of the present invention take advantage of the observation that the laser diode's current to luminance characteristic varies in a predictable way over temperature. Specifically, the characteristic for any temperature is observed to be substantially equal to performance at any other temperature with an appropriate scalar applied to the current. For example, a nominal laser diode current to luminance characteristic can be written as follows:

$$L = f(I) \qquad (1)$$

where L is luminance and I is current. This equation can be inverted to show current as a function of desired luminance as follows:

$$I = g(L) \qquad (2)$$

When equation (1) represents a nominal diode characteristic such as 220 (FIG. 2), then equation (2) represents a mapping component characteristic such as 210 (FIG. 2) that compensates for the nominal case. As the temperature changes, the functions $f$ and $g$ change, but the second function can be approximated by:

$$I = A \times g(L) \qquad (3)$$

where A is a temperature dependent scalar with a finite range. The laser diode characteristic behaves similarly with age.

Taking advantage of the above observation, various embodiments of the present invention can, with a single calibration pulse, measure the difference between the laser diode's nominal operating characteristic and an existing operating characteristic. Further, the calibration pulse can be at any brightness, including dim enough so as to be virtually invisible to an observer. The calibration pulse is issued and the resulting luminance is measured and then compared with the expected luminance corresponding to the calibration pulse. In some embodiments, drive currents corresponding to the calibration pulse and the measured output luminance are compared. A ratio of these drive currents may be utilized to modify the gain value on node 133. In other embodiments, the gain value is simply increased or decreased after each calibration pulse until the expected luminance and measured luminance values match within a threshold.

Figure 4:
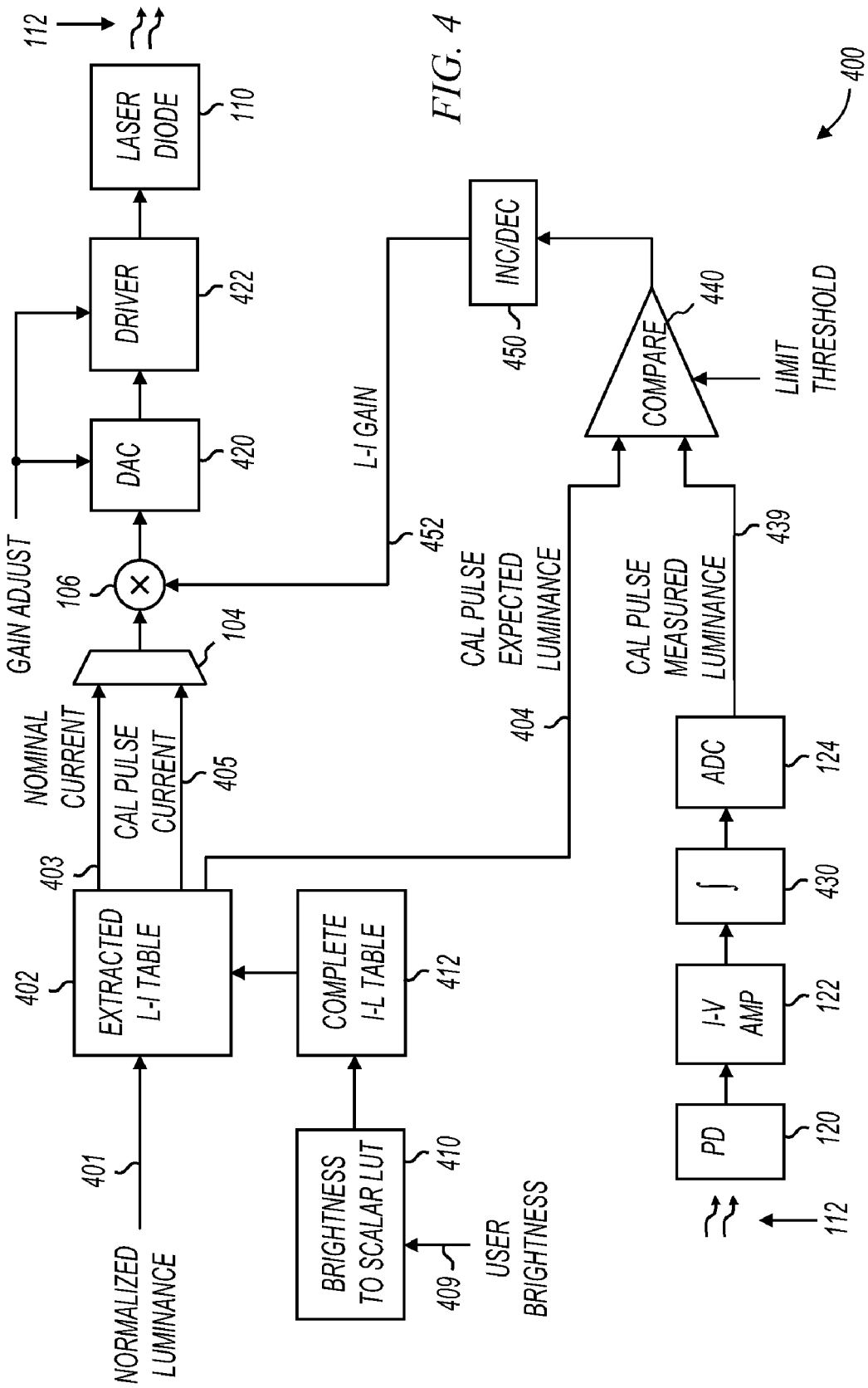
FIG. 4 shows a laser projection apparatus with laser diode drive current compensation.

FIG. 4 shows a laser projection apparatus with laser diode drive current compensation. Laser projection apparatus 400 is a circuit that includes a laser diode, a photodiode, and other associated circuitry to compensate for changes in laser diode characteristics that result from temperature changes and aging. The apparatus shown in FIG. 4 compensates one color channel. For example, the apparatus of FIG. 4 may compensate for changes in a red laser diode, a green laser diode, a blue laser diode, or any other color laser diode.

Apparatus 400 may function in "normal" operation, or in "calibration." When in normal operation, the normalized luminance value at 401 may change to represent the brightness of successive pixels to be displayed. Also during normal operation, laser diode 110 produces light at 112 corresponding to the normalized luminance. During calibration, a calibration pulse current is passed through laser diode 110, and laser diode 110 produces light at 112 that corresponds to the calibration pulse current.

Apparatus 400 receives a normalized luminance value at 401. The normalized luminance values are represented as values between zero and one, with one being the brightest and zero being dark. The normalized luminance may be provided by an image processing apparatus. For example, the normalized luminance values may be provided by a video processing apparatus.

Extracted L-I table 402 is a lookup table that compensates for the nonlinearity in the laser diode 110 by including the inverse of the laser diode nominal I-L characteristic. When combined, the laser diode and lookup table characteristics provide an end-to-end linear response between the normalized luminance and the actual photonic output of the laser diode (210, 220, 230, FIG. 2).

Multiplexer 104 selects either the nominal current value or the calibration pulse current value to source to multiplier 106. During normal operation (e.g., when displaying an image), multiplexer 104 selects the nominal current value. During calibration, multiplexer 104 selects the calibration pulse current value to source to multiplier 106.

Multiplexer 104 may be controlled with hardware or software that times the operation of the calibration procedure. This control hardware or software is not shown in FIG. 4 for simplicity. One skilled in the art will understand how to implement any necessary control circuitry. In some embodiments, multiplexer 104 is omitted, and extracted L-I table 402 sources multiplier 106 directly. In these embodiments, extracted L-I table 402 is commanded to output a current value corresponding to a calibration pulse during the calibration procedure.

During normal operation, the nominal current value is scaled by the L-I gain value, and the result is provided to DAC

420. DAC 420 converts the scaled current value to an analog signal, and driver 422 then drives laser diode 110 which produces light at 112.

In some embodiments, DAC 420 and driver 422 have adjustable gain. For example, in some embodiments, driver 422 may include a variable gain amplifier (VGA). This might be useful at the low end of the laser diode's I-L curve where it may be desirable to give up dynamic range for increased resolution in drive current. This is supported in embodiments in which multiplier 106 has sufficient range.

For example, assume that DAC 420 is a 10 bit DAC with a full scale output corresponding to a laser current of 1 A and each step corresponds to approximately 1 mA. At low brightness levels, it may be desirable to drive the laser diode at a maximum of 500 mA. In this case, the VGA can be set to a gain of ½, so that the DAC's full scale output corresponds to a laser current of 500 mA and each step corresponds to about 0.5 mA. This provides more precise control of luminance. To make this function correctly, the L-I gain value on node 452 is increased by a factor of two.

The closed loop performance of apparatus 400 substantially removes any errors in VGA gain. For example, if the VGA exhibits a gain of 0.51 instead of ½, the closed loop calibration operation will compensate by modifying the L-I gain value on node 452 accordingly.

The complete I-L table 412 includes data representing a fixed current (I) to luminance (L) curve that spans a large range of luminance and current and represents the complete laser diode operating curve for a given set of operating conditions (e.g., age, temp). For example, in some embodiments, complete I-L table 412 includes data corresponding to nominal characteristic 320 (FIG. 3).

In some embodiments, the diode characteristics may be measured and the I-L table 412 may be loaded during manufacture, and the contents of I-L table 412 may be static thereafter. In other embodiments, the characteristics of the laser diode may be periodically measured, and I-L table 412 may be periodically updated. For example, in some embodiments, the characteristics of the laser diode may be measured at power-on, and the I-L table 412 may be static until power is cycled.

In some embodiments, a portion of the complete diode operating curve is extracted for use based on the application or user preference. For example, based on preference, a user may set the brightness control such that only the lower 50% of the I-L curve is used. Also for example, when used in a head-up display application, the brightness control may be set much higher to overcome ambient light conditions.

The user brightness level is set at 409, and the user brightness level is mapped to a scalar value by look-up table (LUT) 410. The brightness scalar is used in the extraction of L-I data to be loaded in L-I table 402. In some embodiments, the user brightness to scalar LUT 410 may not be linear. For example, the mapping may be calibrated based on a human's perception of brightness.

Apparatus 400 includes a luminance measurement apparatus to measure luminance during calibration. The luminance measurement apparatus includes photodiode 120, transimpedance amplifier 122, integrator 430, and analog-to-digital converter (ADC) 124. Photodiode 120 detects light emitted from laser diode 110, and supplies a proportional current to transimpedance amplifier 122. Voltage output from transimpedance amplifier 122 is integrated in the analog domain for a period of time to increase signal-to-noise ratio (SNR). The integration time may be set to any value without departing from the scope of the present invention. In some embodiments, multiple integration periods are used. For example, photodiode dark current and transimpedance amplifier offsets may be compensated for by integrating first a short calibration pulse followed by a long calibration pulse, each integrated over a separate time period of a same or substantially similar duration, and then subtracting to find the difference. ADC 124 converts the integrated voltage to a digital value. The output of ADC 124 is proportional to the amount of light detected by photodiode 120 during the integration period.

Comparator 440 receives the measured luminance value on node 439 and an expected luminance value on node 404 from L-I table 402. The expected luminance value corresponds to the calibration pulse current value on node 405. The luminance/current data pair on nodes 404/405 corresponds to the point on the nominal laser diode curve being used for calibration. Any point on the nominal laser diode curve may be used without departing from the scope of the present invention. In some embodiments, a small valued pair is used. For example, a point at 10% of full scale may be chosen for calibration. Also for example, a point near or just below the "knee" of the diode curve may be chosen. A low luminance value may be advantageously utilized because it is less likely to cause concern to a viewer.

Comparator 440 compares the calibration pulse expected luminance value and the calibration pulse measured luminance value. If they differ by at least a threshold (limit threshold), then the output of comparator 440 causes incrementer/decrementer (INC/DEC) 450 to modify the L-I gain value on node 452. The L-I gain value is modified after each calibration pulse when the expected and measured luminance values differ by the limit threshold. In embodiments represented by FIG. 4, the L-I gain value is incremented or decremented each time the expected and measured luminance values differ by the limit threshold. In other embodiments, a proportional controller may be used to modify the L-I gain value in response to the comparator. A proportional controller may adjust the gain value by a value proportional to the output of the comparator, rather than incrementing or decrementing.

In some embodiments, the calibration procedure is performed periodically. For example, in some embodiments, calibration may be performed at the end of every frame in an image display system or video display system. In other embodiments, calibration may be performed after a number of frames. In these embodiments, the calibration may be performed when the laser light is out of the normal display area, thereby reducing unwanted light in an image. It should be noted, however, that the calibration can be performed with any frequency and in any location relative to a displayed image without departing from the scope of the present invention.

The various components shown in FIG. 4 can be implemented in many different ways. For example, various components may be implemented in digital hardware, analog hardware, software, or any combination. Further, the various embodiments of the present invention may be implemented with any level of integration. For example, many of the components may be included in application specific integrated circuits.

Figure 5:
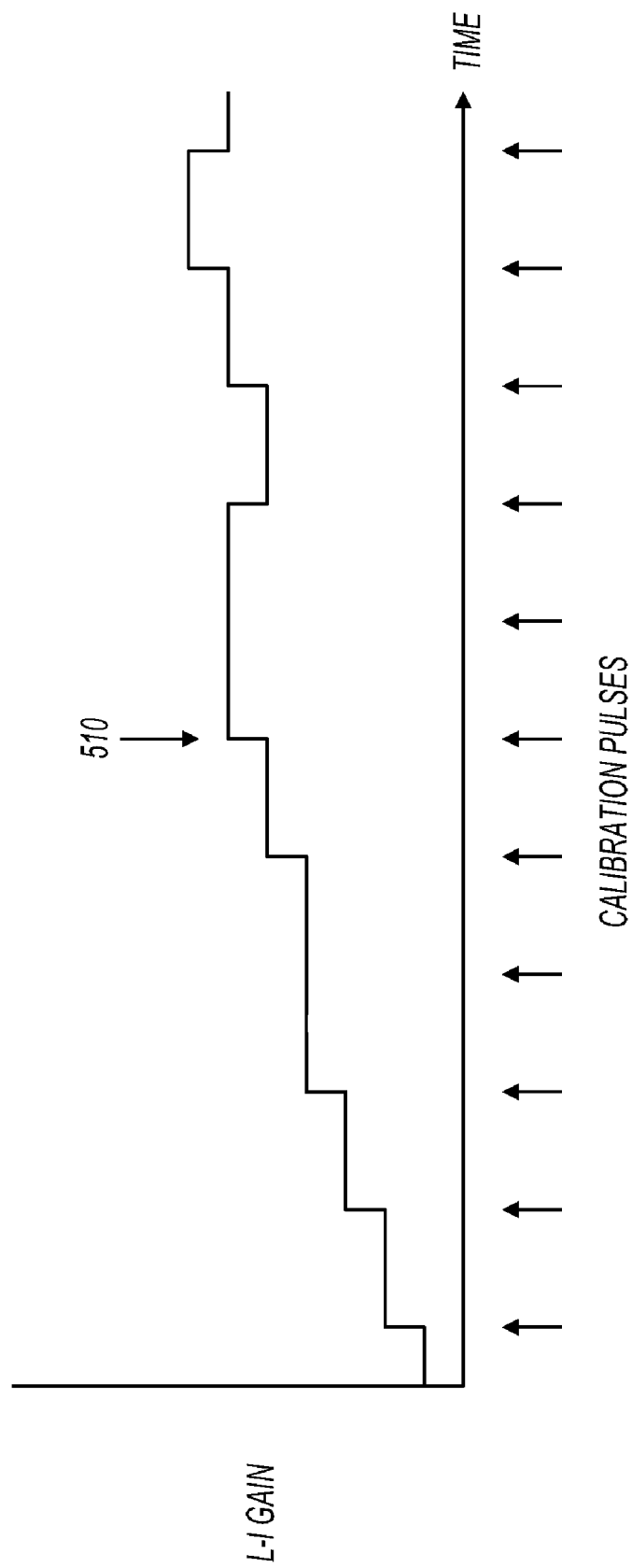
FIG. 5 shows a possible gain value over time for the apparatus of FIG. 4.

FIG. 5 shows a possible gain value over time for the apparatus of FIG. 4. The horizontal axis represents time, and the vertical axis represents the L-I gain value on node 452 (FIG. 4). The arrows beneath the horizontal axis represent calibration pulses. The time between the arrows (cal pulses) may be any value. In some embodiments, the time between the arrows corresponds to one video frame. In these embodiments, a calibration pulse is run through the apparatus once for each video frame. Each time an arrow is shown, a calibration pulse is provided to the laser diode, an actual luminance is measured, and the measured luminance is compared to an expected luminance. In response to the comparison, the L-I gain value is either increased, decreased, or left static.

In the example of FIG. 5, the L-I gain value increases monotonically until 510, at which time it levels off for a few calibration periods. This increase in L-I gain may occur as a result of increasing laser diode temperature. After point 510, the L-I gain is shown decreasing and increasing as necessary to compensate for changes in the laser diode characteristic.

Figure 6:
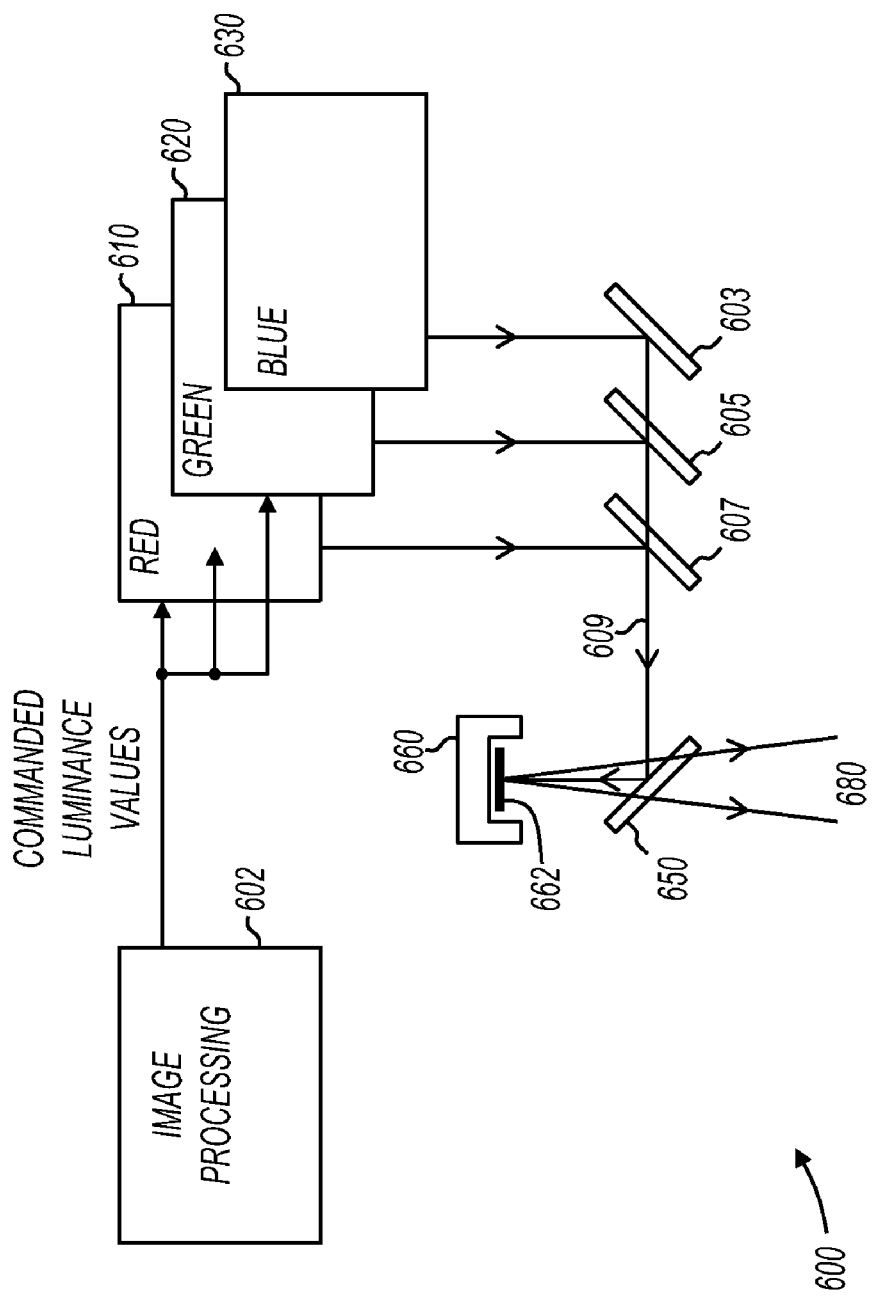
FIG. 6 shows a color laser projector.

FIG. 6 shows a color laser projector. Color laser projector 600 includes three laser projection apparatus 610, 620, and 630, each corresponding to a different color laser diode. Laser projection apparatus 610 corresponds to a laser projection apparatus (e.g., 100, FIG. 1; 400, FIG. 4) having a red laser diode. Laser projection apparatus 620 corresponds to a laser projection apparatus (e.g., 100, FIG. 1; 400, FIG. 4) having a green laser diode. Laser projection apparatus 630 corresponds to a laser projection apparatus (e.g., 100, FIG. 1; 400, FIG. 4) having a blue laser diode.

Each of the laser projection apparatus 610, 620, and 630 independently control their own internal L-I gain value using the mechanisms described herein. Separate luminance control of each color also provides color balancing, in part because the luminance ratios between colors remain substantially constant when each color channel has tight luminance control.

Image processing apparatus 602 provides commanded luminance values to each of laser projection apparatus 610, 620, and 630. The commanded luminance values correspond to the normalized luminance values on node 401 (FIG. 4), and further correspond to pixel intensities for the various colors within an image. The commanded luminance values change in a synchronized fashion along with scanning circuitry that causes a composite color laser beam to scan an image.

Color laser projector 600 also includes mirrors 603, 605, and 607, filter/polarizer 650, and micro-electronic machine (MEMS) device 660 having mirror 662. Red, green, and blue light is provided by the laser projection apparatus 610, 620, and 630. Laser diodes typically produce light as a column, and this column emerges as a narrow beam. The narrow beams are combined into a composite color beam at 609 by mirrors 603, 605, and 607. The composite beam reflects off filter/polarizer 650, and is directed at the MEMS mirror 662.

The MEMS mirror rotates on two axes to sweep the reflected composite beam in both horizontal and vertical directions. The composite beam reflected by scan mirror 662 has a greater angular extent after reflection. This beam passes through filter/polarizer 650 and displays an image at 680.

The trajectory that the beam takes is a function of the signals received from scanning circuitry (not shown). In some embodiments, the beam may sweep back and forth horizontally in a sinusoidal pattern. Further, in some embodiments, the beam may sweep up and down vertically in a sinusoidal pattern. In general, the beam may be swept in any combination of horizontal and vertical patterns, including linear and non-linear patterns. Pixels may be displayed when the beam is sweeping in one direction or in both directions. For example, in some embodiments, pixels may be displayed as the beam sweeps down in the vertical direction, but not when the beam sweeps back up. Also for example, in some embodiments, pixels may be displayed as the beam sweeps down as well as when the beam sweeps up in the vertical direction.

Color laser projector 600 may periodically perform a calibration procedure. For example, in some embodiments, each laser projection apparatus 610, 620, and 630 may perform a calibration using a calibration pulse at the end of a vertical sweep. Each laser projection apparatus 610, 620, and 630 may simultaneously perform the calibration, or each laser projection apparatus 610, 620, and 630 may perform calibrations in series. In some embodiments, each laser projection apparatus 610, 620, and 630 perform a calibration every third vertical sweep. In these embodiments, one of the laser projection apparatus performs a calibration for each video frame.

The MEMS based projector is described as an example, and the various embodiments of the invention are not so limited. For example, other projector types may be included in projection systems with laser diode compensation without departing from the scope of the present invention.

Figure 7:
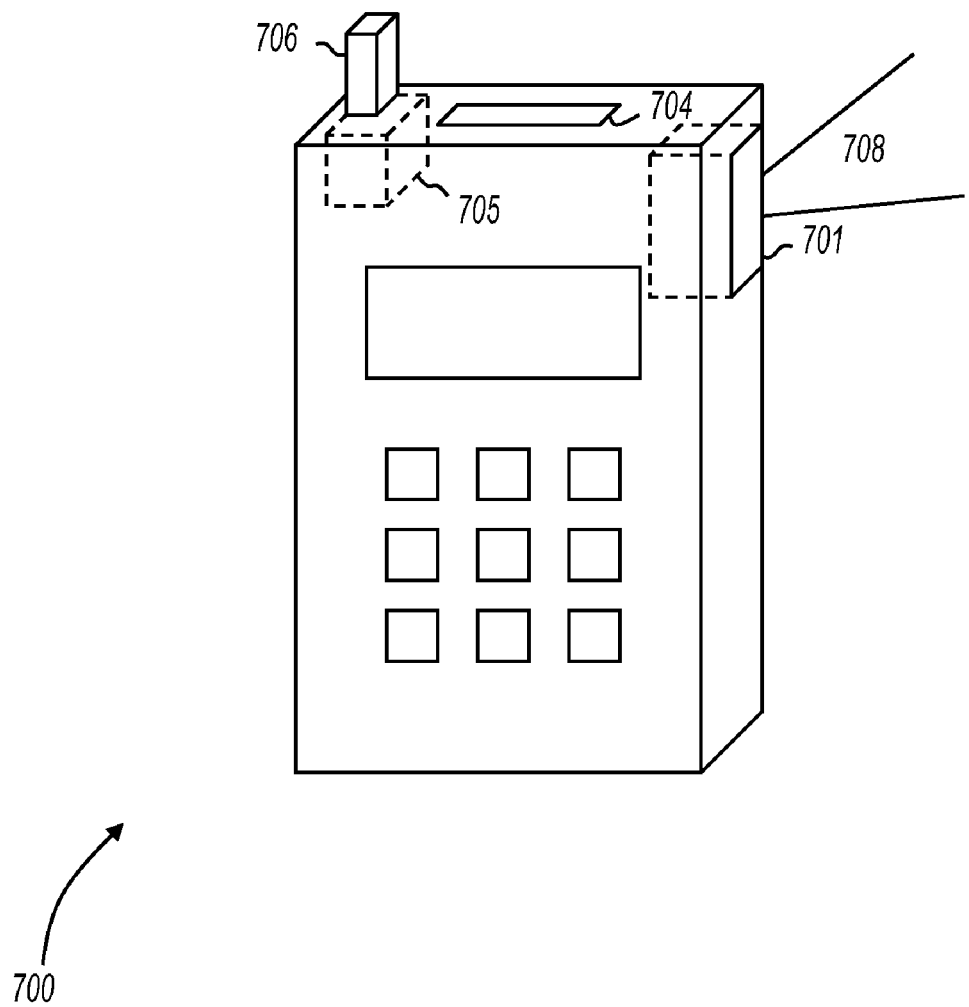
FIG. 7 shows a mobile device in accordance with various embodiments of the present invention.

FIG. 7 shows a mobile device in accordance with various embodiments of the present invention. Mobile device 700 may be a hand held projection device with or without communications ability. For example, in some embodiments, mobile device 700 may be a handheld projector with little or no other capabilities. Also for example, in some embodiments, mobile device 700 may be a portable music player. Also for example, in some embodiments, mobile device 700 may be a device usable for communications, including for example, a cellular phone, a smart phone, a personal digital assistant (PDA), a global positioning system (GPS) receiver, or the like. Further, mobile device 700 may be connected to a larger network via a wireless (for example, WiMax) or cellular connection, or this device can accept data messages or video content via an unregulated spectrum (for example, WiFi) connection.

Mobile device 700 includes laser projector 701 to create an image with light 708. Similar to other embodiments of projection systems described above, mobile device 700 may include feedback loops useful for compensating for changes in laser diode characteristics.

In some embodiments, mobile device 700 includes antenna 706 and electronic component 705. In some embodiments, electronic component 705 includes a receiver, and in other embodiments, electronic component 705 includes a transceiver. For example, in GPS embodiments, electronic component 705 may be a GPS receiver. In these embodiments, the image displayed by laser projector 701 may be related to the position of the mobile device. Also for example, electronic component 705 may be a transceiver suitable for two-way communications. In these embodiments, mobile device 700 may be a cellular telephone, a two-way radio, a network interface card (NIC), or the like.

Mobile device 700 also includes memory card slot 704. In some embodiments, a memory card inserted in memory card slot 704 may provide a source for video data to be displayed by laser projector 701. Memory card slot 704 may receive any type of solid state memory device, including for example, Multimedia Memory Cards (MMCs), Memory Stick DUOs, secure digital (SD) memory cards, and Smart Media cards. The foregoing list is meant to be exemplary, and not exhaustive.

Figure 8:
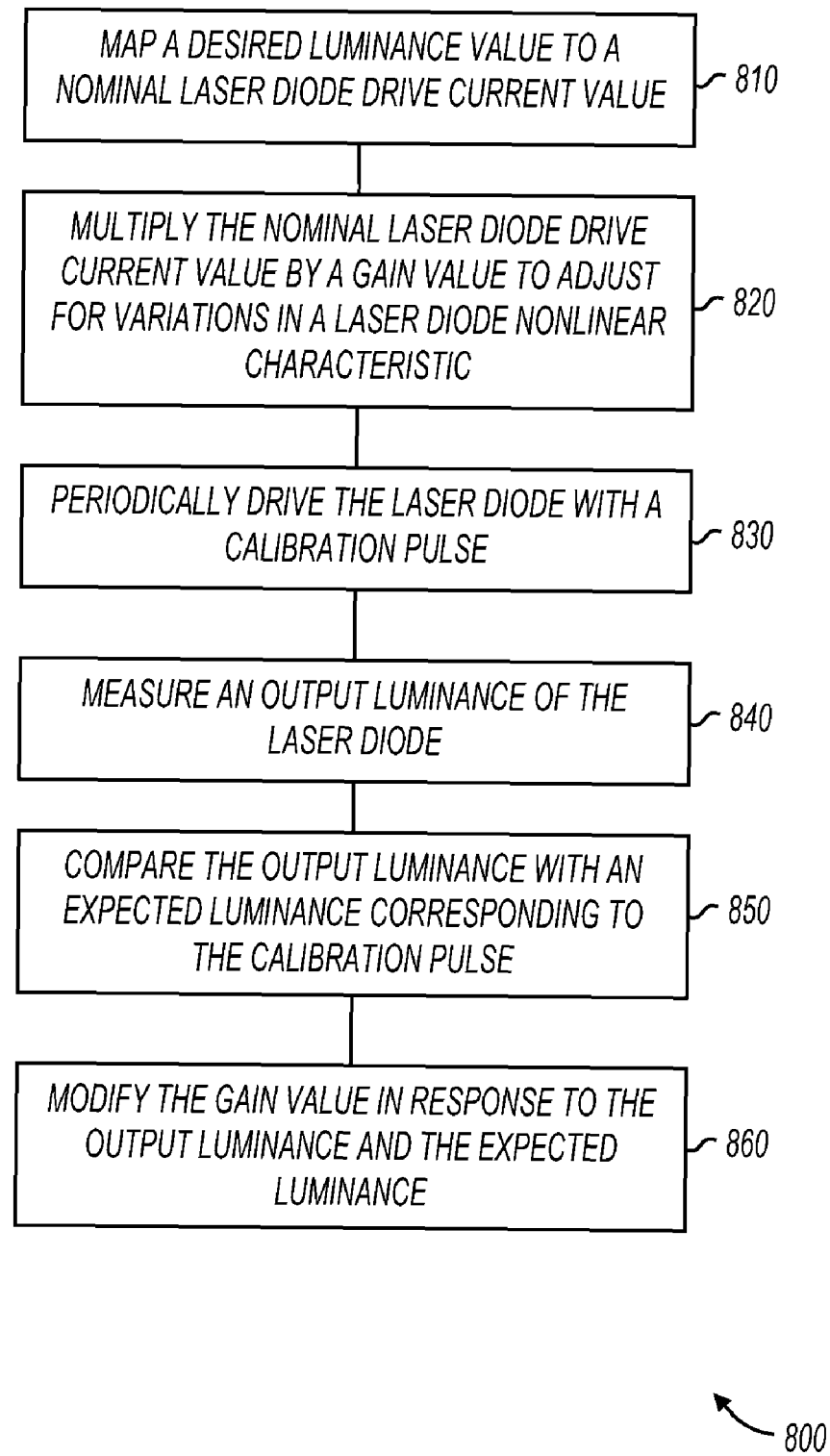
FIG. 8 shows a flowchart in accordance with various embodiments of the present invention.

FIG. 8 shows a flowchart in accordance with various embodiments of the present invention. In some embodiments, method 800, or portions thereof, is performed by a laser projector, a mobile device, or the like, embodiments of which are shown in previous figures. In other embodiments, method 800 is performed by an integrated circuit or an electronic system. Method 800 is not limited by the particular type of apparatus performing the method. The various actions in method 800 may be performed in the order presented, or may be performed in a different order. Further, in some embodiments, some actions listed in FIG. 8 are omitted from method 800.

Method 800 is shown beginning with block 810 in which desired luminance values are mapped to nominal laser diode drive currents. In some embodiments, desired luminance values are produced by image processing or video processing components within a projection device. Desired luminance values may include different luminance values for different color laser diodes to display one pixel in an image. Desired luminance values may also include different luminance values for each laser diode for a number of pixels. Desired luminance values may be mapped to nominal drive current values using any suitable means. For example, L-I mapping component 102 (FIG. 1) or extracted L-I table 402 (FIG. 4) may be used to map desired luminance values to nominal laser diode current values.

At 820, the nominal laser diode drive current value is multiplied by a gain value to adjust for variations in a laser diode nonlinear characteristic. This gain value corresponds to the gain values on nodes 133 (FIG. 1) or 452 (FIG. 4). The scaled nominal laser diode drive current value may then be converted to an analog laser diode drive current using a digital-to-analog converter (DAC). As described above with reference to FIG. 4, the DAC and a following driver may have variable gains so as to provide for increased resolution at lower drive current levels.

At 830, the laser diode is periodically driven with a calibration pulse. The laser diode drive current corresponding to the calibration pulse may be any known value. In some embodiments, a small value is chosen to reduce the visibility of any light produced during the calibration.

At 840, an output luminance of the laser diode resulting from the calibration pulse is measured. Output luminance values are produced by photodiodes such as those shown in FIGS. 1 and 4. At 850, the output luminance is compared with an expected luminance that corresponds to the calibration pulse, and at 860, the gain value is modified in response to the output luminance and the expected luminance.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An apparatus comprising:
a laser diode having a nonlinear current to output luminance characteristic;
a look-up table to map desired luminance values to nominal laser diode current values, wherein the look-up table compensates for the nonlinear current to output luminance characteristic in the laser diode by combining a mapping component with the nonlinear current to output luminance characteristic of the laser diode to provide a substantially linear response between the desired luminance values and the nominal laser diode current values, wherein the mapping component is substantially an inverse of the nonlinear current to output luminance characteristic of the laser diode;
a multiplier coupled to multiply the nominal laser diode current values by a gain value; and
a feedback loop to measure actual output luminance and adjust the gain value, wherein the look-up table is operable to periodically output a desired luminance value corresponding to a periodic calibration pulse, wherein laser diode output for the calibration pulse does not represent brightness of successive pixels to be displayed, and wherein the feedback loop comprises circuitry to measure the actual output luminance of the calibration pulse.

2. The apparatus of claim 1 wherein the feedback loop comprises:
a photodiode to measure the actual output luminance; and
a comparator to compare the actual output luminance with an expected output luminance.

3. The apparatus of claim 2 wherein the expected output luminance corresponds to a calibration pulse.

4. A laser projector comprising:
a plurality of laser diodes;
a plurality of look-up tables to map desired luminance values to laser diode drive current values for each of the plurality of laser diodes, wherein the plurality of look-up tables compensate for a nonlinear current to output luminance characteristic in each of the plurality of laser diodes by combining a mapping component with the nonlinear current to output luminance characteristic of each of the respective laser diodes to provide a substantially linear response between the desired luminance values and the laser diode drive current values, wherein the mapping component is substantially an inverse of the nonlinear current to output luminance characteristic of the each of the respective laser diodes, wherein the plurality of look-up tables are operable to periodically output a desired luminance value corresponding to a periodic calibration pulse, and wherein laser diode output for the calibration pulse does not represent brightness of successive pixels to be displayed; and
a plurality of multiplier circuits coupled to adjust the laser diode drive current values to compensate for heating and aging effects.

5. The laser projector of claim 4 further comprising:
a plurality of photodiodes to measure actual output luminance from the plurality of laser diodes; and
a plurality of feedback circuits to influence operation of the plurality of multiplier circuits in response to the actual output luminance.

6. The laser projector of claim 4 wherein the plurality of feedback circuits include comparison circuits to produce gain values to provide to the plurality of multiplier circuits, the comparison circuits being responsive to expected luminance values and measured luminance values.

7. The laser projector of claim 6 wherein the expected luminance values and measured luminance values correspond to calibration pulses.

8. The laser projector of claim 4 wherein the plurality of laser diodes comprises a red laser diode, a green laser diode, and a blue laser diode.

9. A mobile device comprising:
a laser projector to project an image, the laser projector comprising:
a laser diode subject to heating based on video content;
a look-up table to map desired luminance values to nominal laser diode current values, wherein the look-up table compensates for a nonlinear current to output luminance characteristic in the laser diode by combining a mapping component with the nonlinear current to output luminance characteristic of the laser diode to provide a substantially linear response between the desired luminance values and the nominal laser diode current values, wherein the mapping component is substantially an inverse of the nonlinear current to output luminance characteristic of the laser diode;

a multiplier coupled to multiply the nominal laser diode current values by a gain value; and a feedback loop to measure actual output luminance and adjust the gain value, wherein the look-up table is operable to periodically output a desired luminance value corresponding to a periodic calibration pulse, wherein laser diode output for the calibration pulse does not represent brightness of successive pixels to be displayed, and wherein the feedback loop comprises circuitry to measure the actual output luminance of the calibration pulse.

10. The mobile device of claim 9 further comprising a communications transceiver.

11. The mobile device of claim 10 wherein the feedback loop comprises:

a photodiode to measure the actual output luminance; and a comparator to compare the actual output luminance with an expected output luminance.

12. The mobile device of claim 9 further comprising a memory card slot.

13. A laser projector comprising:

means for mapping desired luminance values to nominal laser diode drive current values, wherein the means for mapping compensates for a nonlinear current to output luminance characteristic in a laser diode by combining a mapping component with the nonlinear current to output luminance characteristic of the laser diode to provide a substantially linear response between the desired luminance values and the nominal laser diode drive current values, wherein the mapping component is substantially an inverse of the nonlinear current to output luminance characteristic of the laser diode;

means for multiplying the nominal laser diode drive current values with a gain value; and means for modifying the gain value to compensate for changes in a laser diode characteristic, wherein the means for mapping is operable to periodically output a desired luminance value corresponding to a periodic calibration pulse, wherein laser diode output for the calibration pulse does not represent brightness of successive pixels to be displayed, and wherein the means for modifying the gain value comprises circuitry to measure the actual output luminance of the calibration pulse.

14. The laser projector of claim 13 further comprising means for periodically producing the calibration pulse.

15. The laser projector of claim 14 wherein the means for modifying the gain value comprises a comparator to compare a measured laser output luminance value with an expected laser output luminance value, where the measured and expected laser output luminance values correspond to the calibration pulse.

16. A method comprising:

mapping a desired luminance value to a nominal drive current value to drive a laser diode having a nonlinear characteristic, wherein the mapping compensates for the nonlinear characteristic in by combining a mapping component with the nonlinear characteristic to provide a substantially linear response between the desired luminance value and the nominal drive current value, wherein the mapping component is substantially an inverse of the nonlinear characteristic, wherein the mapping is operable to periodically output the desired luminance value corresponding to a periodic calibration pulse, wherein laser diode output for the calibration pulse does not represent brightness of successive pixels to be displayed;

multiplying the nominal drive current value by a gain value to adjust for variations in the nonlinear characteristic; and driving the laser diode.

17. The method of claim 16 further comprising:

measuring an output luminance of the laser diode; and adjusting the gain value in response to the output luminance.

18. The method of claim 17 wherein adjusting the gain value in response to the output luminance comprises comparing the output luminance with an expected output luminance.

19. The method of claim 16 wherein mapping comprises indexing into a look-up table with the desired luminance value.

* * * * *